United States Patent [19]

Goldthorp

[11] 3,973,141

[45] Aug. 3, 1976

[54] TRANSISTOR DRIVER CIRCUIT

[75] Inventor: David Clayton Goldthorp, Reading, Pa.

[73] Assignee: Bell Telephone Laboratories, Incorporated, Murray Hill, N.J.

[22] Filed: Dec. 27, 1974

[21] Appl. No.: 536,851

[52] U.S. Cl. .............................. 307/255; 307/296; 307/315; 307/299 A
[51] Int. Cl.² ................... H02K 17/00; H03K 17/60
[58] Field of Search .............. 307/255, 54, 53, 303, 307/296, 315, 299 A; 330/17

[56] References Cited
UNITED STATES PATENTS

| | | | |
|---|---|---|---|
| 3,195,018 | 7/1965 | Geger | 330/17 |
| 3,766,410 | 10/1973 | Elsaesser | 307/255 |

Primary Examiner—Stanley D. Miller, Jr.
Assistant Examiner—B. P. Davis
Attorney, Agent, or Firm—F. W. Padden

[57] ABSTRACT

This specification discloses transistor circuitry suitable for use as a switch or as a floating current driver to control the concurrent operation of a pair of utilization devices. The circuitry comprises an NPN and a PNP output transistor which are substantially simultaneously switchable to ON and OFF states by a bias control means. The output transistors each have a collector connectable to a utilization device and a voltage of a prescribed polarity. Emitters of the output transistors are connected together in a floating voltage arrangement via a resistor. The bias control means comprises a pair of NPN transistors and a diode connected PNP transistor illustrated for switching the NPN output transistor and then the PNP output transistor to ON and OFF states. A logic gate switches a constant current to the bias control transistors for controlling the switching operations.

13 Claims, 1 Drawing Figure

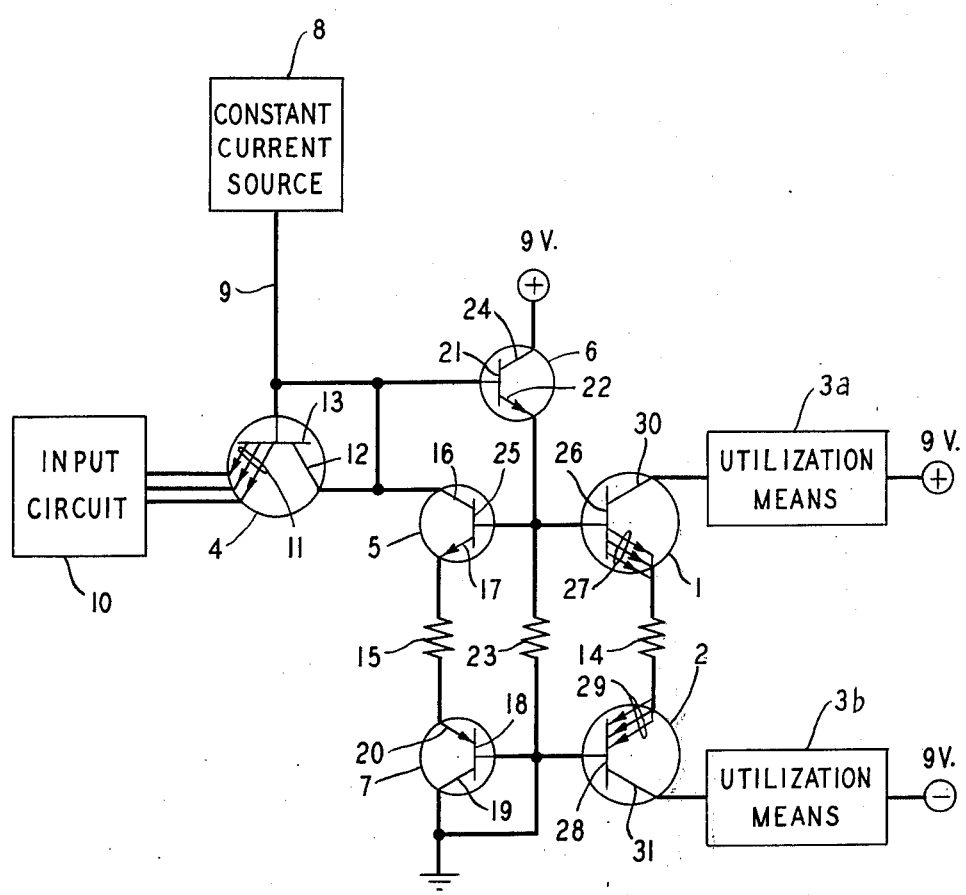

TRANSISTOR DRIVER CIRCUIT

BACKGROUND OF THE INVENTION

This invention relates to electrical circuits and particularly to transistor circuitry suitable for use as a switch or as a floating current driver for plural utilization devices.

It has often been desirable in the design of control circuits to provide simple and economical circuitry for switchably and substantially concurrently driving a plurality of utilization devices. Applications for such circuits are found in arrangements where, by way of illustration, it is beneficial to apply operating or bias voltages simultaneously to a plurality of utilization devices. Examples of such devices are electromechanical relays and electronic switches. Among the latter category of switches are the so-called semiconductor bridges which find widespread use in telemetering, time division switching and other telecommunication systems. Despite extensive innovation in control circuit design, a need yet exists for improved circuit arrangements for accomplishing the foregoing functions.

Accordingly, it is an object of my invention to provide an improved transistor switch circuit and particularly a switchable circuit for concurrently driving plural utilization devices.

SUMMARY OF THE INVENTION

The foregoing object is achieved in accordance with a specific exemplary embodiment of my invention in which a transistor circuit is used to control the concurrent operation of a pair of utilization devices. The circuit advantageously is a floating current switch or driver for the pair of devices. Functionally, the circuit is switchable to ON and OFF current states and in response to input signals for controlling the operation and release of the utilization devices. During its OFF state, the driver is effectively an open circuit to isolate each of the utilization devices from one another and to preclude their operation. The driver functions during its ON state to connect the utilization devices in series and thereby to supply equal value coincident currents for operating them.

According to an aspect of the illustrative embodiment, the driver functions as a multiplier of current from a constant current source. Illustratively, the constant current is switchably connected for the current multiplication from the source to bias an output transistor of the driver circuit and advantageously under control of a transistor logic gate operating in response to signals from an input circuit. The gate is activatable for diverting the constant current from the bias control transistors and for thereby switching the driver to its OFF state. By way of example, an ON state of the driver is achieved by deactivating the logic gate and enabling the constant current to be applied to the bias control and output transistors for the current multiplication and concurrent operation of the utilization means by series equal value currents.

In effect, the floating current driver illustratively functions as a switch for simultaneously and serially operating both of the utilization means. The driver comprises a pair of output transistors of oppositely conductive NPN and PNP types. A collector of the NPN transistor is connected through one of the utilization devices to a positive voltage and a collector of the PNP transistor is connected through the other one of the utilization devices to a negative voltage. Emitters of the PNP and NPN are serially connected together in a floating voltage arrangement through a single resistor. Thus, the utilization devices are isolated from one another during the OFF state of the PNP and NPN transistors and effectively no current flows therethrough for operating the utilization devices.

The output transistors function as a floating current low impedance switch serially to connect through their collector-emitter electrodes the pair of utilization devices and in response to base current drive applied to the NPN transistor by the bias control transistors. The latter transistors illustratively are rendered conductive by the current supplied by the constant current source when the logic gate is deactivated. Two NPN transistors and one diode configured PNP transistor comprise the bias control elements for the output transistors. A first one of the NPN transistors provides for the forward biasing of the second NPN transistor and the diode connected PNP transistor when the logic gate is deactivated. The first NPN transistor has its emitter connected to the base of the NPN output transistor as well as through a resistor to ground potential which is also applied to the base of the PNP output transistor. A collector of the first NPN transistor is connected to a positive voltage while its base is connected to the current output of the constant current source. The second NPN transistor of the bias control transistors also has its collector connected to the current ouput of the constant current source and its base connected to a junction of a base of the NPN output transistor and the emitter of the first NPN bias transistor. An emitter of the second NPN bias transistor is series aidingly connected with the diode connected PNP transistor and another resistor to ground.

According to the illustrative embodiment the logic gate comprises a diode connected transistor having its base connected to its collector and to the output of the constant current source, while its emitters are connected to the input circuit. As a result, when input signals are applied to activate the gate the latter diverts substantially all of the constant current from the bias control and output transistors which thereby are rendered effectively nonconductive with both utilization devices nonoperated. On the other hand, when input signals cause the deactivation of the logic gate, constant current switches all of the bias control and output transistors to their forward bias states. Consequently, the output transistors provide a high impedance floating constant current path for concurrently operating both utilization devices via the series forward biased collector-emitter electrodes of the output transistors.

BRIEF DESCRIPTION OF THE DRAWING

The invention, together with its various objects and features, may be more fully understood from a reading of the following description of a specific illustrative embodiment taken in conjunction with the accompanying single sheet of a schematic and block diagram drawing of the exemplary floating drive current circuit.

DETAILED DESCRIPTION

In the drawing, there is shown a switchable floating current source circuit comprising six transistors, namely NPN and PNP output transistors 1 and 2 for providing floating current to utilization means 3a and 3b, an input logic gate NPN transistor 4, bias and output driver NPN transistors 5 and 6, and a bias PNP transistor 7.

A constant current source 8 supplies a regulated current on conductor 9 for activating transistors 5–7 and, in turn, transistors 1 and 2. In the illustrative embodiment, the current on conductor 9 is of a positive polarity and is selectively switched to transistors 5 and 6 by gate transistor 4 and in response to a receipt of control signals from an input circuit 10. Gate 4 has an ON and an OFF state. In its ON, or forward biased state, gate 4 functions to turn OFF the transistors 5–7, 1 and 2 for withdrawing the floating output current to utilization means 3a and 3b. In its OFF, or reverse biased state, gate 4 enables transistors 5–7, 1 and 2 to be turned ON for supplying floating current drive to utilization means 3a and 3b.

In the illustrative embodiment, gate 4 comprises TTL (Transistor Transistor Logic) having three input emitters 11, a collector 12 and a base 13. Transistor 4 functions as a diode by having its collector directly connected to its base. In response to a receipt from input circuit 10 of an input LOW signal (approximately ground potential) on any one of the emitters 11, transistor 4 is forward biased to its ON state and the current on conductor 9 flows through base 13 and emitter 11 into the input circuit 10 and thereby effectively bypasses the transistors 5 and 6. On the other hand, when HIGH (approximately +5 volts) signals are applied to all of the emitters 11, transistor 4 is switched OFF for enabling the current on conductor 9 to switch ON the transistors 5–7 and, in turn, the transistors 1 and 2.

A feature of my invention is that the floating current transistor circuitry comprises a multiplier of the current on conductor 9 for providing desired current drive for the utilization means 3a and 3b. The transistor circuitry may be segregated for discussion into two parts; one of which is a current multiplier comprising transistors 1 and 2 and the other of which comprises the transistor drivers 5, 6, and 7 for transistors 1 and 2. Current multiplication is achieved by utilizing a bias resistor 14 for transistors 1 and 2 which is illustratively about four times smaller than a bias resistor 15 for transistors 5 and 7. It is further achieved advantageously by having the base-emitter junctions of transistors 1 and 2 larger than the base-emitter junctions of transistors 5 and 7 such that illustratively four times the current can flow through transistors 1 and 2 as flows through transistors 5 and 7 with approximately the same base-emitter voltage drops. Another factor contributing to the current multiplication is of course, the load (not shown) of utilization means 3a and 3b.

During the aforementioned OFF state of transistor gate 4, the NPN transistor 5 draws substantially all of the current on conductor 9 through its collector 16 and emitter 17, resistor 15 and PNP transistor 7 to ground potential. The bias for enabling transistor 5 to so conduct the current on conductor 9 is established in part by transistor 7 which functions as a diode inasmuch as its base 18 is connected to its collector 19 and thereby enables series aiding current to flow from its emitter 20 for transistor 5. A remainder of the bias for transistor 5 is established by transistor 6 which, during the OFF state of transistor 4, draws a small amount of current from conductor 9 through its base 21 to emitter 22 and a resistor 23 for providing current drive illustratively from +9 volts through its collector 24 to emitter 22 for the bases 25 and 26 of transistors 5 and 1. By supplying such base current drive, transistor 7 buffers excessive current from being diverted from the collector 16 of transistor 5.

In view of the foregoing, the transistor circuitry is a current multiplier illustratively of 4:1, that is, four times the current will flow through resistor 14 as flows through resistor 15 when transistor gate 4 is OFF. The current is dependent principally upon the ratio of resistor 14 to resistor 15 and the matching of the base-emitter junctions of transistors 1, 2, 5 and 7.

Thus, when transistor 4 is switched OFF, as priorly explained, the constant current on conductor 9 concurrently flows through transistors 5 and 7 via resistor 15 to ground as well as through transistor 6 and resistor 23. The resultant base drive for transistor 1 concurrently forward biases its base-emitter 26–27 and the base-emitter 28–29 of transistor 2 via resistor 14 for serially supplying drive currents from the collectors 30 and 31 of transistors 1 and 2 through the load circuitry of utilization means 3a and 3b to the respective +9 and −9 volt supplies.

On the other hand, when transistor 4 is switched ON, as previously described, the current on conductor 9 is diverted from transistors 5 and 6 via transistor 4 to the input circuit 10, and, accordingly, all of the transistors 1, 2 and 5–7 are zero biased to withhold drive current from the utilization means 3. Upon such current diversion, the resistor 23 removes base current from transistors 1 and 5 for enabling a rapid withdrawal of drive current from utilization means 3.

The circuit disclosed in the drawing finds specific utility as a symmetrical turn-on turn-off circuit for matched current arrangements controlling a semiconductor bridge circuit as disclosed in D. G. Hill (Case 5) U.S. patent application Ser. No. 536,852, and Embree-Goldthorp (Case 10-2) U.S. Patent application Ser. No. 536,853, filed concurrently herewith.

While a specific embodiment of the invention has been described above, it will be apparent to one skilled in the art that numerous modifications within the scope and spirit of the following claims are possible. For example, the subject invention may be used as a floating current source without the utilization means 3a and 3b and unbalanced to balanced converter with resistive loads. Without the resistive loads the circuit realizes equal value coincident current sources, one of which is capable of sinking current from a positive supply and the other of which is capable of sourcing current to a negative supply. The circuit is also useful to simultaneously gate positive and negative current sources in an integrated circuit such as an operational amplifier high speed comparator or any other circuit which may be susceptible to faults latch up problems during applications of power.

What is claimed is:

1. An electrical switch circuit comprising
a pair of output transistors of oppositely conductive type and each having base and collector electrodes and at least one emitter electrode,
each of said collector electrodes forming and output terminal of said circuit,
a resistor connected between said at least one emitter electrode of a first one of said transistors and said at least one emitter electrode of a second one of said transistors,
bias control means connected to said base electrode of said first one of said transistors for steady state reverse bias of both of said transistors and operable for switching said transistors to a forward bias state, a source of DC potential connected to said base electrode of a second one of said transistors, means supplying an electrical current, and logic means responsive to a receipt of input signals for selectively applying said current to operate said bias control means for switching said output transistors from said reverse to said forward bias state, and wherein said means supplying said electrical current comprises a source of constant current and said bias control means comprises a transistor arrangement responsive to an application of said constant current to said base electrode of said first one of said output transistors for switching said output transistors to said forward bias state.

2. The invention of claim 1 wherein said transistor arrangement comprises a bias transistor having a base terminal connected to said base electrode of said first one of said transistors, a collector terminal connected to said constant current source and emitter means connectable to said source of DC potential.

3. The invention of claim 2 wherein said emitter means comprises bias circuitry including a diode connected transistor and a resistor.

4. The invention of claim 3 wherein said bias control means further comprises another resistor connected between said base electrodes of said first and second output transistors and another source of DC potential, another transistor having a collector connected to said other source of DC potential, a base connected to said constant current source and an emitter connected to said base electrode of said first one of said output transistors.

5. The invention of claim 4 wherein said logic means comprises a transistor having base and collector electrodes connected to said collector terminal of said bias transistor and at least one emitter for receiving said input signals.

6. A floating current circuit for a plurality of utilization devices each one of which is connectable to a source of DC potential of a prescribed polarity and said circuit comprising a pair of output transistors of oppositely conductive type and each having base and collector electrodes and at least one emitter electrode, each of said collector electrodes being connectable to an individual one of said devices, resistor means connecting each of said emitter electrode of a first one of said transistors to each said emitter electrode of a second one of said transistors, means supplying an electrical current, and bias control means connected to said base electrode and responsive to a receipt of said current for forward biasing said transistors, and wherein said bias control means comprises a semiconductor bias means and a bias transistor having an emitter terminal connected to said semiconductor bias means, a base terminal connected to said base electrode of said first one of said output transistors, and a collector terminal connected to said means supplying said electrical current.

7. The invention of claim 6 wherein said semiconductor bias means comprises a diode connected transistor having a collector element connectable to another source of DC potential, a base element connected to said collector element and to said base electrode of said second one of output transistor and an emitter element connectable to said emitter terminal of said bias transistor.

8. The invention of claim 7 further comprising a resistor connected between said emitter element of said diode connected transistor and said emitter terminal of said bias transistor.

9. The invention of claim 7 wherein said bias control means further comprises another transistor having emitter means connected to said base terminal of said bias transistor, collector means connectable to an additional source of DC potential and base means connected to said collector terminal of said bias transistor.

10. The invention of claim 9 wherein said means supplying said electrical current includes a source supplying a constant current to said collector terminal of said bias transistor.

11. The invention of claim 9 further comprising logic means responsive to a receipt of input signals for selectively applying said constant current to said collector terminal of said bias transistor for switching said output transistors between forward and reverse bias states.

12. The invention of claim 9 wherein said logic means comprises a transistor having base and collector electrodes connected to said collector terminal of said bias transistor and at least one emitter for receiving said input signals.

13. Transistor circuitry comprising a pair of oppositely conductive type transistors each having base, collector and emitter electrodes, each of said collector electrodes forming an output terminal, at least one resistor connecting said emitter electrodes together, a DC potential connected to a base electrode of a first one of said transistors, bias control means including a constant current source connectable to said base electrode of a second one of said transistors and responsive to a receipt of an electrical control signal for connecting said current source to said base electrode of said second one of said transistors for switchably biasing both of said transistors from a reverse bias state to a forward bias high impedance constant current state between each of said collector-emitter electrodes.

* * * * *